(12) United States Patent
Min et al.

(10) Patent No.: US 10,362,667 B2
(45) Date of Patent: Jul. 23, 2019

(54) CIRCUIT BOARD AND MANUFACTURING METHOD THEREOF

(71) Applicant: SAMSUNG ELECTRO-MECHANICS CO., LTD., Suwon-si (KR)

(72) Inventors: Tae-Hong Min, Hwaseong-si (KR); Myung-Sam Kang, Hwaseong-si (KR); Jung-Han Lee, Seoul (KR); Young-Gwan Ko, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/594,085

(22) Filed: May 12, 2017

(65) Prior Publication Data

US 2017/0251548 A1 Aug. 31, 2017

Related U.S. Application Data

(62) Division of application No. 15/050,606, filed on Feb. 23, 2016, now abandoned.

(30) Foreign Application Priority Data

Feb. 23, 2015 (KR) .................... 10-2015-0025166

(51) Int. Cl.
*H05K 1/02* (2006.01)
*H05K 1/18* (2006.01)
*H05K 3/46* (2006.01)
*H05K 1/11* (2006.01)

(52) U.S. Cl.
CPC ......... *H05K 1/0206* (2013.01); *H05K 1/0203* (2013.01); *H05K 1/0204* (2013.01); *H05K 1/181* (2013.01); *H05K 3/4608* (2013.01); *H05K 1/0207* (2013.01); *H05K 1/0218* (2013.01); *H05K 1/111* (2013.01); *H05K 1/183* (2013.01); *H05K 2201/0323* (2013.01); *H05K 2201/0338* (2013.01); *H05K 2201/066* (2013.01); *H05K 2201/10416* (2013.01)

(58) Field of Classification Search
CPC ................. H05K 1/0206; H05K 1/115; H05K 2201/066; H05K 2201/09563; H05K 2201/0323
See application file for complete search history.

(56) References Cited

U.S. PATENT DOCUMENTS

| | | | |
|---|---|---|---|
| 5,958,572 A * | 9/1999 | Schmidt | H01L 23/3733 174/258 |
| 6,205,028 B1 | 3/2001 | Matsumura | |
| 6,222,740 B1 * | 4/2001 | Bovensiepen | H05K 1/0271 174/255 |

(Continued)

*Primary Examiner* — Ishwarbhai B Patel
(74) *Attorney, Agent, or Firm* — NSIP Law

(57) ABSTRACT

A circuit board is disclosed. In addition to insulating layers, the circuit board includes a structure for heat transfer that includes a first layer that is formed of graphite or graphene, a second layer that is formed of metallic material and disposed on one surface of the first layer, and a third layer that is formed of metallic material and disposed on the other surface of the first layer, and at least a portion of the structure for heat transfer is inserted into an insulation layer. Such a circuit board provides improved heat management. Also disclosed is a method of manufacturing the circuit board.

4 Claims, 15 Drawing Sheets

(56) References Cited

U.S. PATENT DOCUMENTS

| | | | |
|---|---|---|---|
| 8,513,530 B2 * | 8/2013 | Sun | H01L 33/642 |
| | | | 174/252 |
| 8,829,362 B2 | 9/2014 | Masuda | |
| 8,895,863 B2 | 11/2014 | Inaba et al. | |
| 2002/0167800 A1 * | 11/2002 | Smalc | H01L 23/3672 |
| | | | 361/710 |
| 2008/0076276 A1 | 3/2008 | Takezaki et al. | |
| 2009/0301765 A1 | 12/2009 | Strauss et al. | |
| 2010/0200277 A1 * | 8/2010 | Huang | H05K 1/0204 |
| | | | 174/252 |
| 2014/0355215 A1 | 12/2014 | Canete et al. | |

* cited by examiner

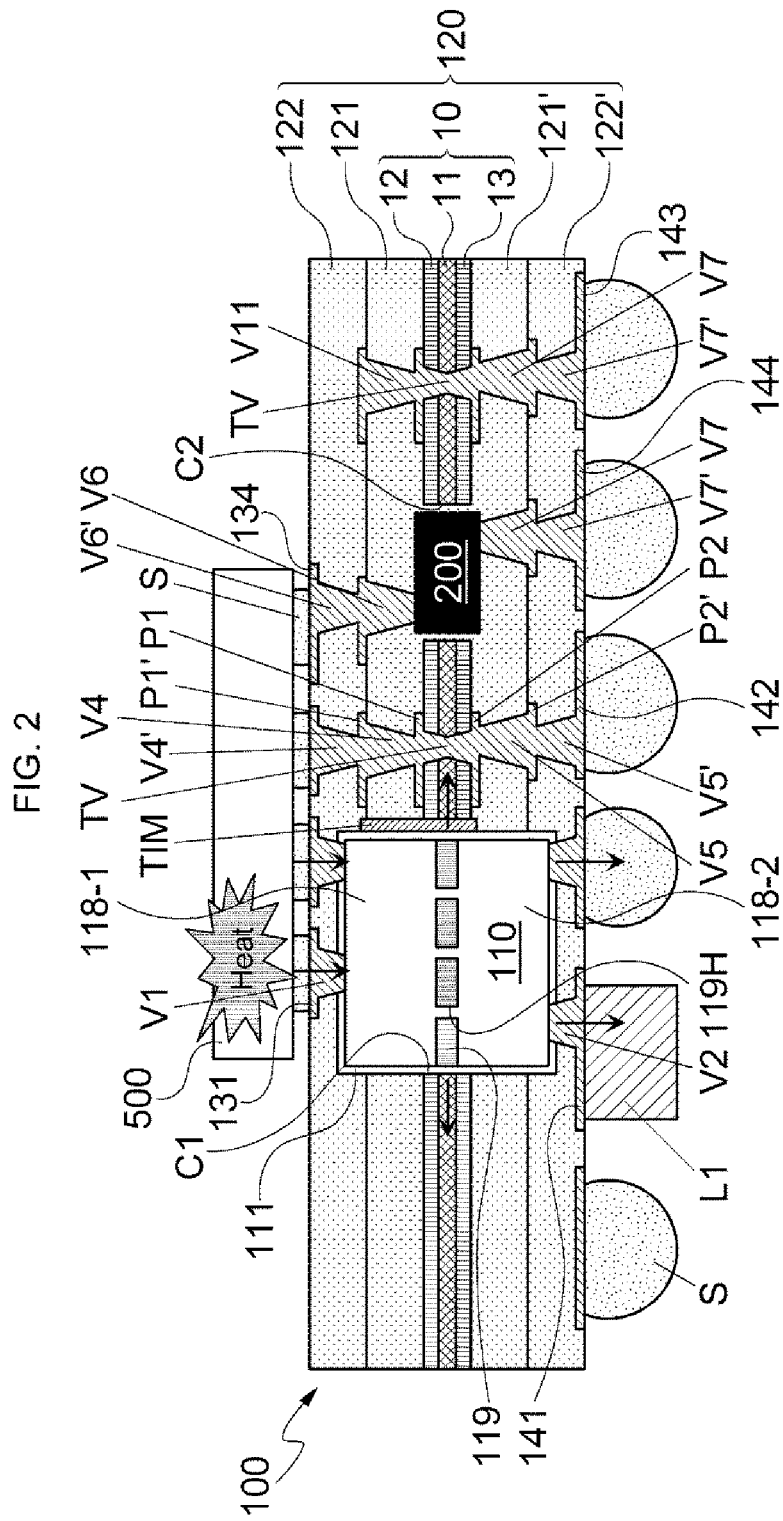

FIG. 11A
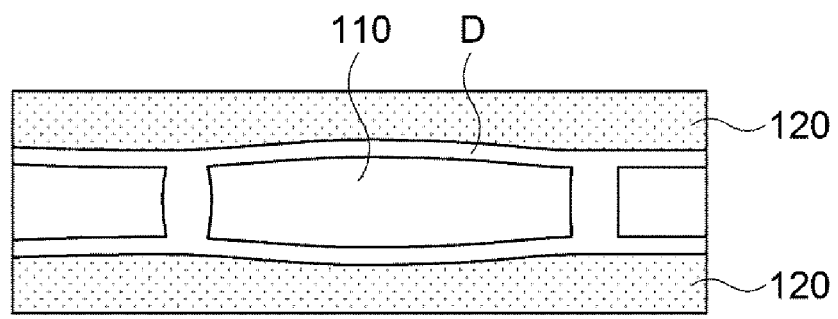
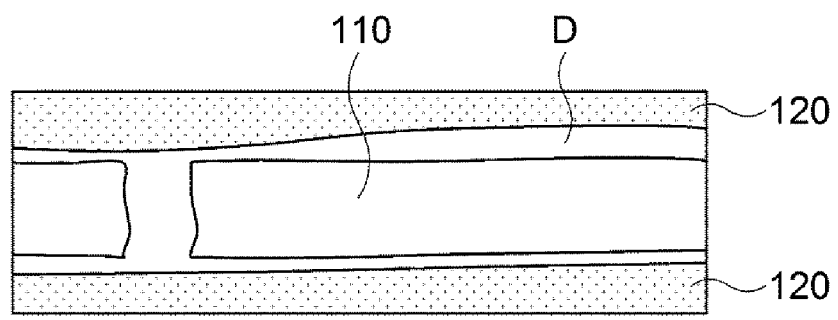
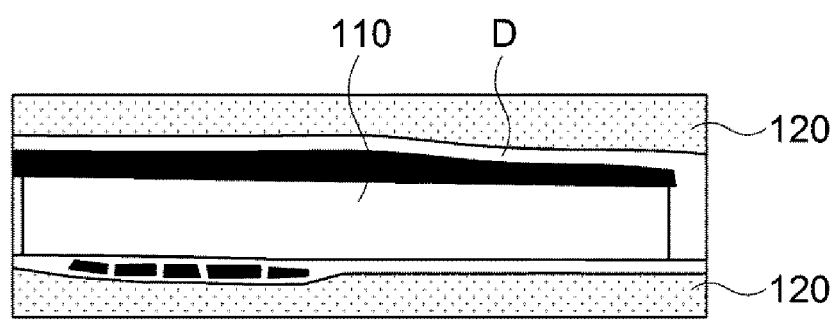

FIG. 11B
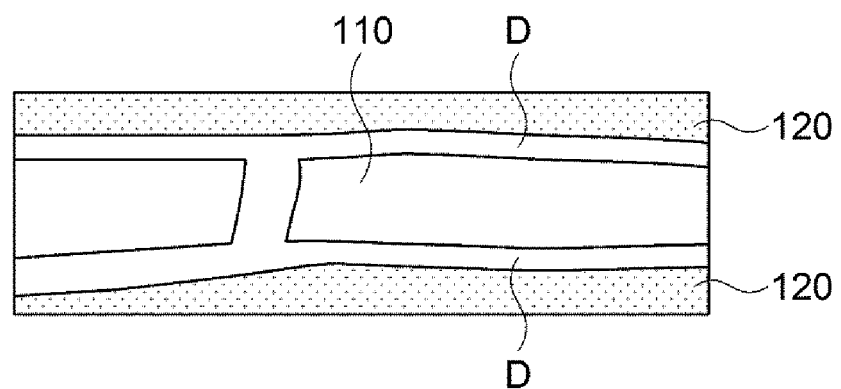
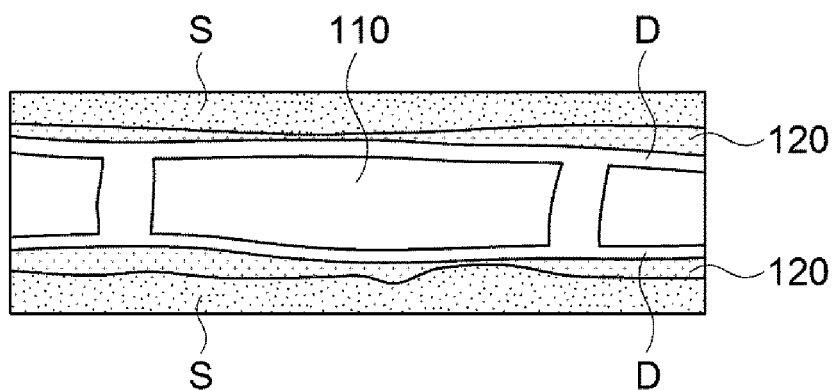

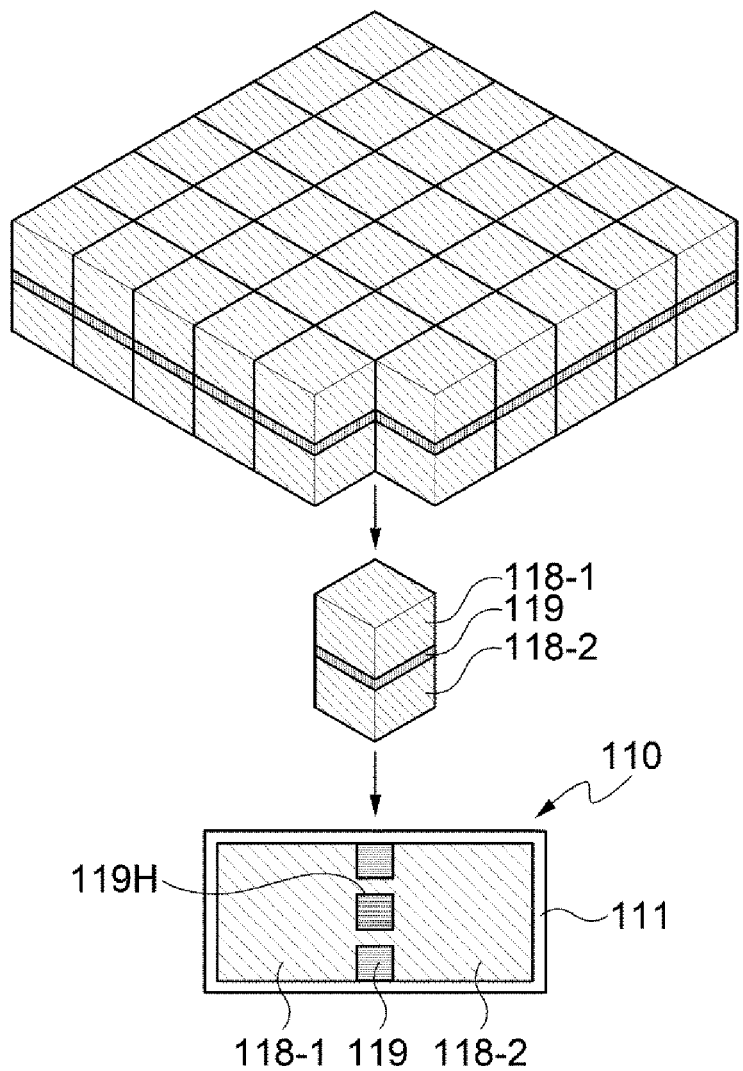

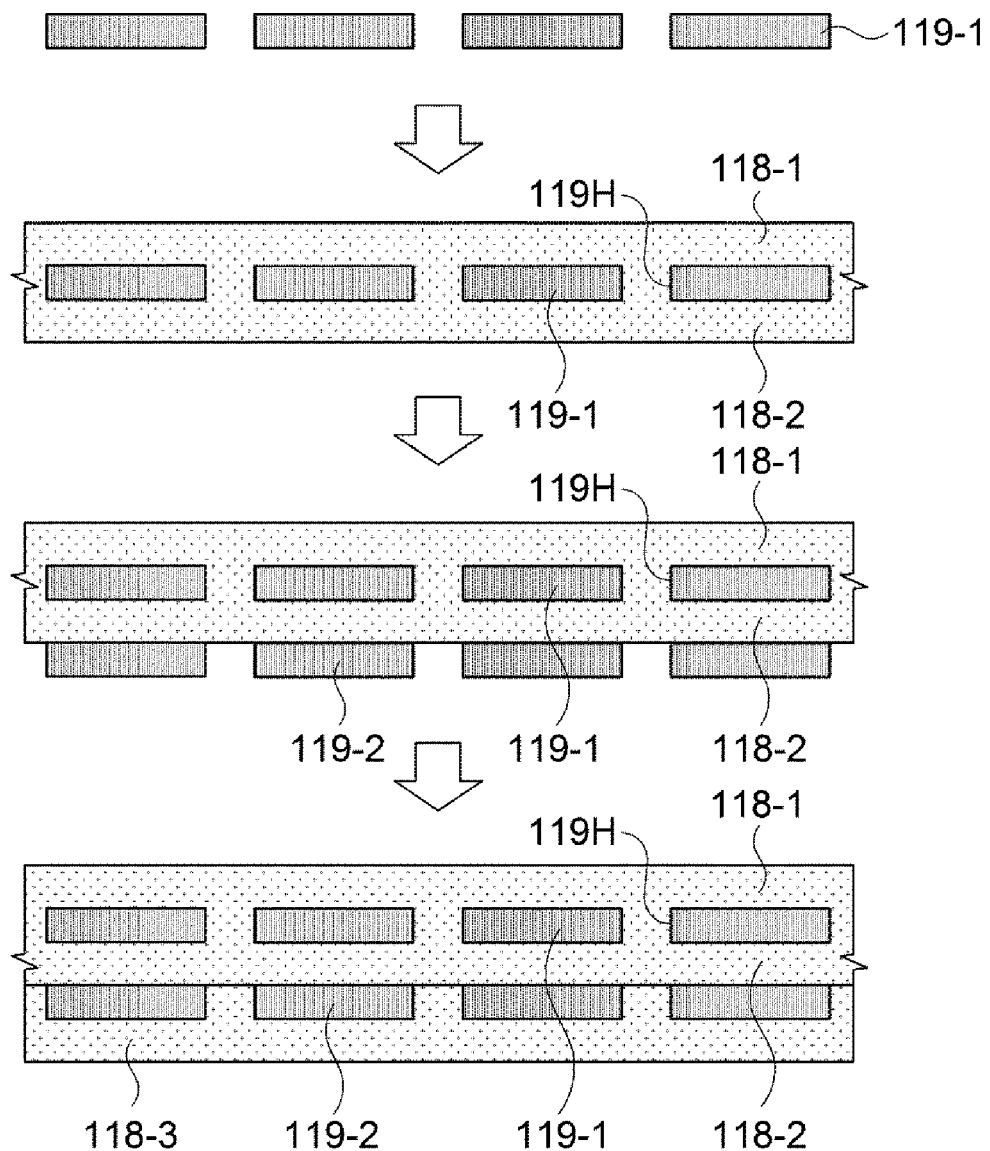

CIRCUIT BOARD AND MANUFACTURING METHOD THEREOF

CROSS-REFERENCE TO RELATED APPLICATION(S)

This application is a division of application Ser. No. 15/050,606 filed on Feb. 23, 2016, now abandoned, which claims the benefit under 35 USC 119(a) of Korean Patent Application No. 10-2015-0025166 filed on Feb. 23, 2015 in the Korean Intellectual Property Office, the entire disclosure of which is incorporated herein by reference for all purposes.

BACKGROUND

1. Field

The following description relates to a circuit board. The following description also relates to a method of manufacturing such a circuit board.

2. Description of Related Art

In accordance with a trend toward light weight, miniaturization, increased speed, multi-functional operation, and improvements in performance of electronic devices, multi-layered substrate technologies in which a plurality of wiring layers are formed on a printed circuit board (PCB) have been developed. Furthermore, technologies in which electronic components such as active elements, passive elements, or other appropriate electronic components, are embedded in a multilayered substrate have also been developed.

As an application processor (AP) that is connected to the multilayered substrate becomes multi-functional and achieves high-performance operation, the heat generation amount produced by the AP increases significantly.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a circuit board includes insulation layers, a structure for heat transfer, wherein at least a portion of the structure for heat transfer is inserted into at least a portion of the insulation layers, metal layers, and vias that penetrate at least one of the insulation layers to connect at least two of the metal layers, wherein the structure for heat transfer includes a first layer, formed of graphite or graphene, a second layer, located on one surface of the first layer and formed of metallic material, and a third layer, located on the other surface of the first layer and formed of metallic material, wherein a boundary surface between the first layer and the second layer or a boundary surface between the first layer and the third layer is perpendicular to a boundary between the insulation layers.

The circuit board may further include penetration holes that penetrate through the first layer and are filled with the same metallic material as the metallic material that forms the second layer and the third layer.

The second layer, the third layer and the metallic material that is filled in the penetration holes may be formed in an integrated manner.

An XY plane of graphite or graphene may be formed in parallel with the boundary surface between the first layer and the second layer.

The first layers may be arranged to be spaced apart from each other so as to form the structure for heat transfer.

The circuit board may further include a first insulation layer, including a cavity into which at least a portion of the structure for heat transfer is inserted, a first via, penetrating a second insulation layer that is located above the first insulation layer, a second via, penetrating a third insulation layer that is located below the first insulation layer, a first metal pattern, located on an outer surface of the second insulation layer and in contact with one end of the first via, and a second metal pattern, located on an outer surface of the third insulation layer and in contact with one end of the second via, wherein the boundary surface between the first layer and the second layer and the boundary layer between the first layer and the third layer are perpendicular to the boundary surface between the first insulation layer and the second insulation layer.

In another general aspect, a circuit board includes insulation layers, a structure for heat transfer, wherein at least a portion of the structure for heat transfer is inserted into at least a portion of the insulation layers, metal layers, and vias that penetrate at least one of the plurality of insulation layers to connect at least two of the metal layers, wherein the structure for heat transfer includes a first layer, formed of graphite or graphene and including penetration holes, and a second layer and a third layer, located on one surface and the other surface of the first layer respectively and formed of metallic material.

A boundary surface between the first layer and the second layer or a boundary surface between the first layer and the third layer may be formed to be parallel with a boundary between the insulation layers.

An XY plane of graphite or graphene may be in parallel with the boundary surface between the first layer and the second layer.

The second layer, the third layer, and the metallic material that is filled in the penetration holes may be formed in an integrated manner.

In another general aspect, a method of manufacturing a circuit board includes forming the circuit board such that the circuit board includes insulation layers and a structure for heat transfer, wherein at least a portion of the structure for heat transfer is inserted into at least a portion of the insulation layers, metal layers, and vias that penetrate at least one of the insulation layers to connect at least two of the metal layers, wherein the structure for heat transfer is formed by providing a first layer that is formed of graphite or graphene and includes penetration holes, and forming a second layer and a third layer by providing metallic material to one surface and the other surface of the first layer and the penetration holes.

A boundary surface between the first layer and the second layer or a boundary surface between the first layer and the third layer may be formed to be perpendicular to a boundary between the insulation layers.

A boundary surface between the first layer and the second layer or a boundary surface between the first layer and the third layer may be formed to be parallel with a boundary between the insulation layers.

Other features and aspects will be apparent from the following detailed description, the drawings, and the claims.

BRIEF DESCRIPTION OF THE DRAWINGS

FIG. 2 is a cross-sectional view schematically showing a circuit board 100 according to another example.

FIG. 11A shows the reflow test result that is performed during the time period in which the insulation part 120 is in direct contact with the structure for heat transfer.

FIG. 11B shows the solder pot test result that is performed during the time period in which the insulation part 120 is in direct contact with the structure for heat transfer.

FIG. 14A illustrates a method of manufacturing the first structure for heat transfer according to an example.

FIG. 15 illustrates a method of manufacturing the first structure for heat transfer according to still another an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, configurations and effects of the present examples are described in further detail with reference to the accompanying drawings.

Figure 1A:
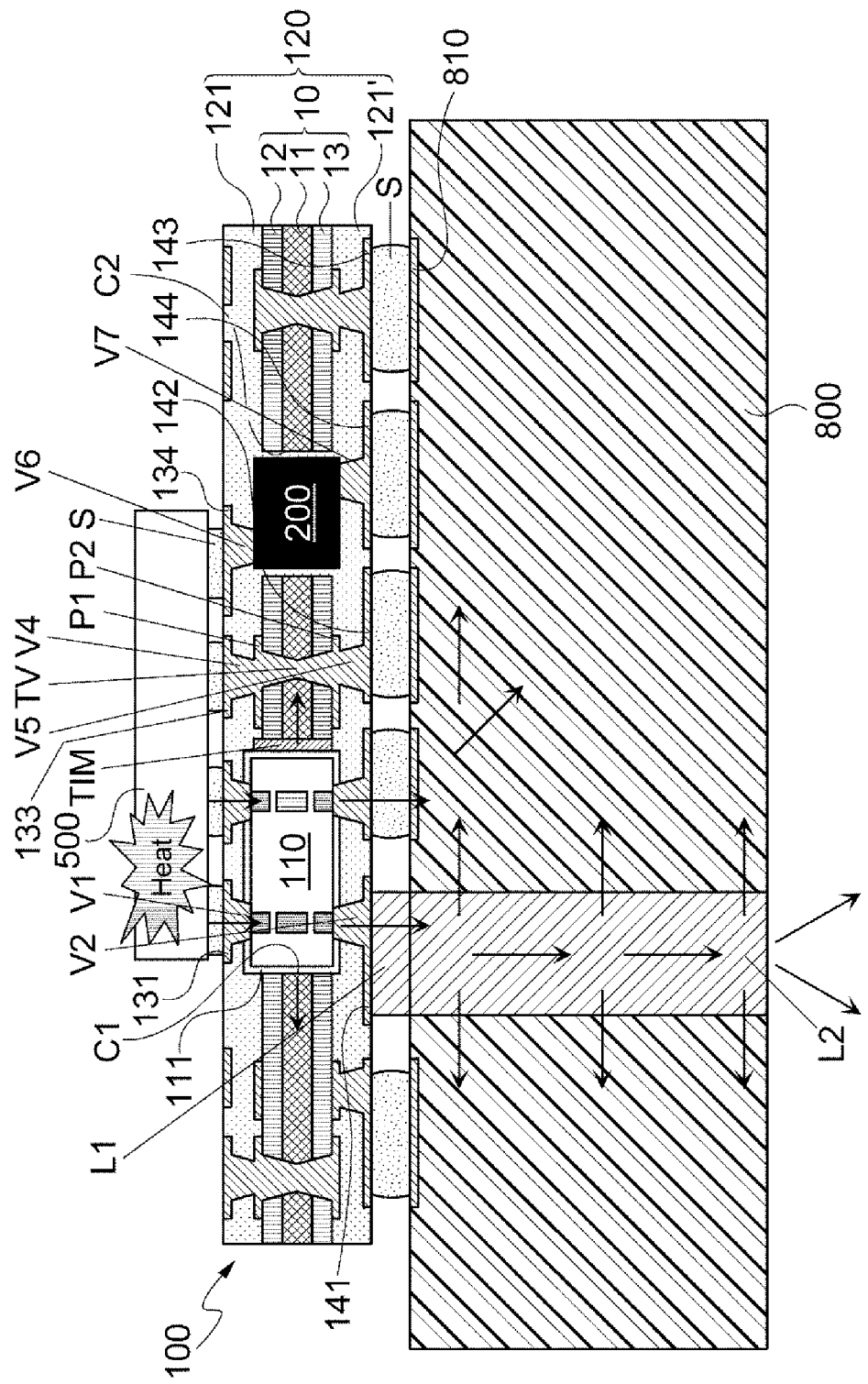
FIG. 1A is a cross-sectional view schematically showing a circuit board according to an example.

FIG. 1A is a cross-sectional view schematically showing a circuit board according to an example. FIGS. 1B through 1G are perspective views schematically showing various examples of the first structure for heat transfer according to an example.

Figure 3:
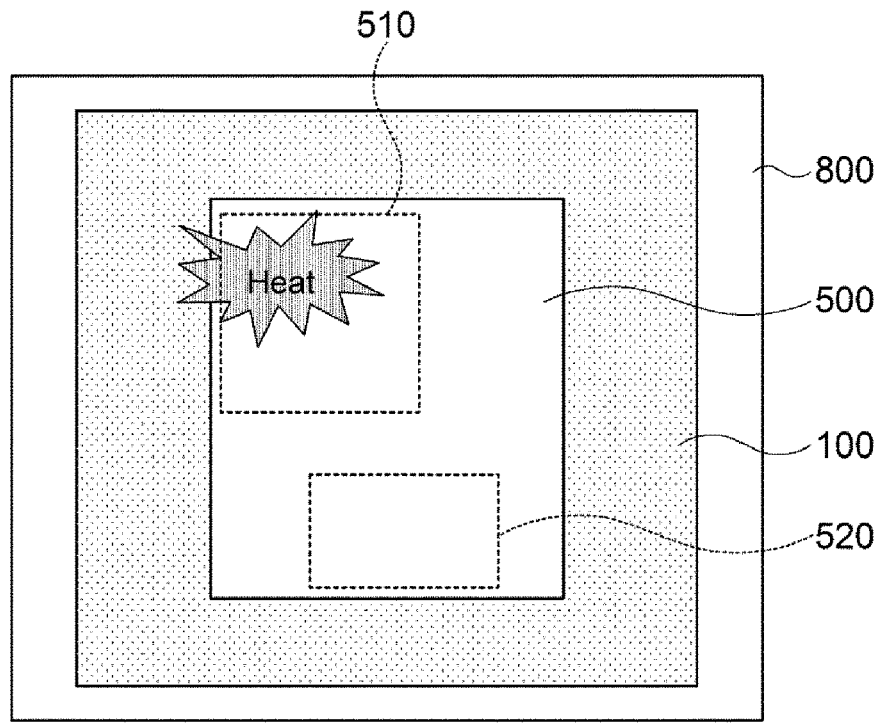
FIG. 3 illustrates a plan view of circuit board 100 according to an example.
Figure 4:
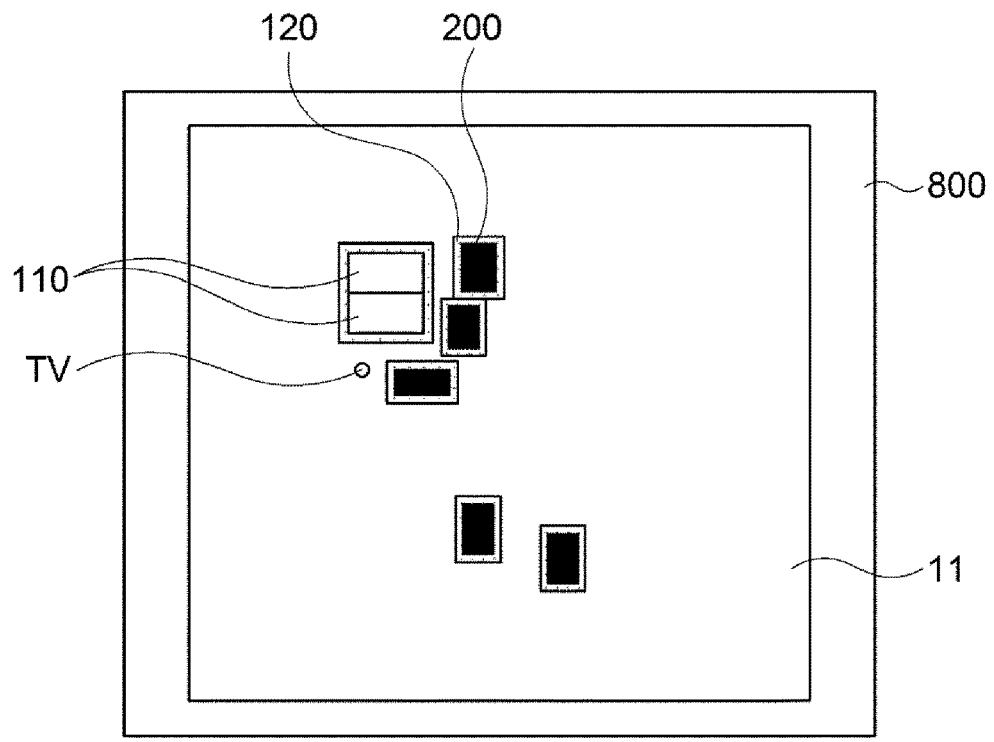
FIG. 4 illustrates a horizontal cross-sectional view of circuit board 100 according to an example.
Figure 5:
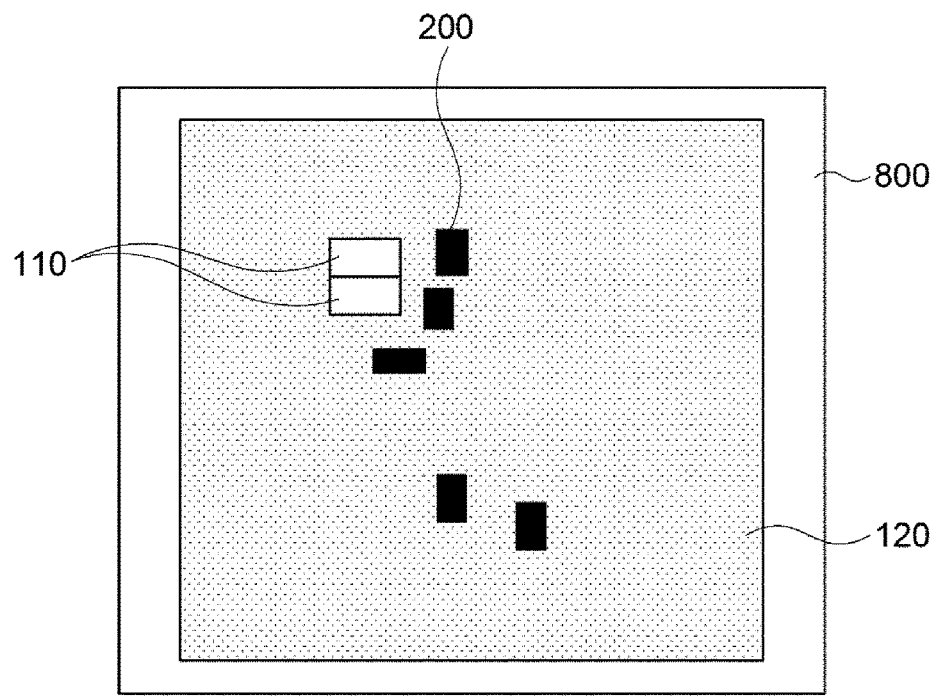
FIG. 5 illustrates a horizontal cross-sectional view of circuit board 100 according to another example.
Figure 6:
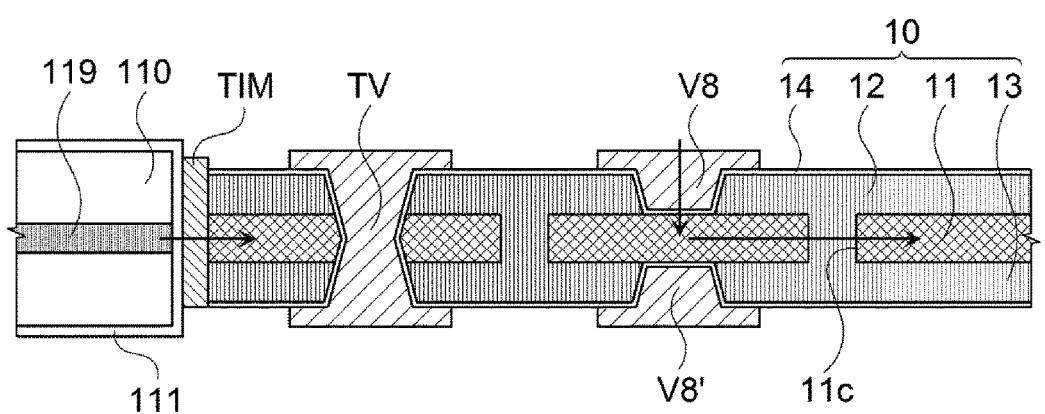
FIG. 6 is a partially enlarged view showing a main component of circuit board 100 according to an example.
Figure 7:
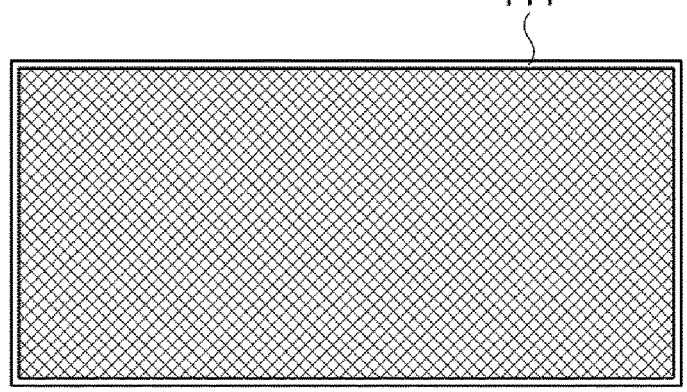
FIG. 7 illustrates the second structure for heat transfer according to an example.
Figure 8:
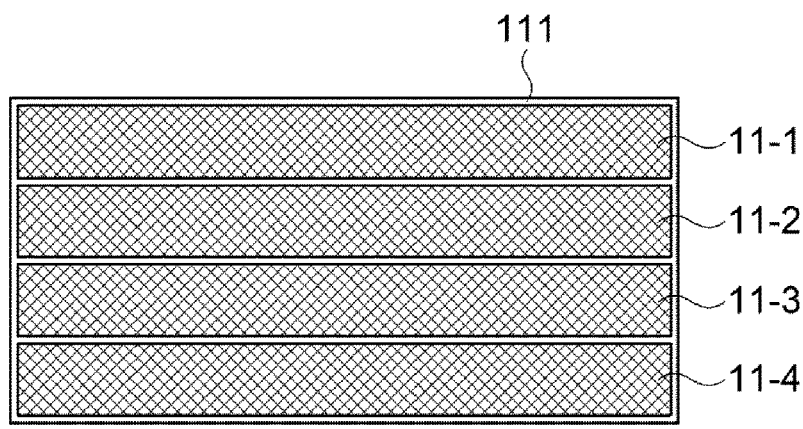
FIG. 8 illustrates the second structure for heat transfer according to another example.
Figure 9:
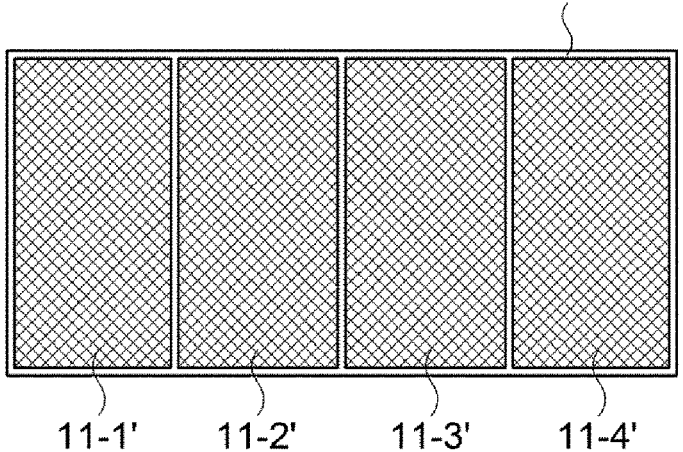
FIG. 9 illustrates the second structure for heat transfer according to still another example.

Further, FIG. 2 is a cross-sectional view schematically showing a circuit board 100 according to another example. FIG. 3 illustrates a plan view of circuit board 100 according to an example. FIG. 4 illustrates a horizontal cross-sectional view of circuit board 100 according to an example. FIG. 5 illustrates a horizontal cross-sectional view of circuit board 100 according to another example. FIG. 6 is a partially enlarged view showing a main component of circuit board 100 according to an example. FIG. 7 illustrates the second structure for heat transfer according to an example. FIG. 8 illustrates the second structure for heat transfer according to another example. FIG. 9 illustrates the second structure for heat transfer according to still another example.

For example, the circuit board 100 according to an example includes the first structure for heat transfer 110, and at least a portion of the first structure for heat transfer 110 is inserted in an insulation part 120. The first structure for heat transfer 110 is formed of a highly thermally conductive material. Also, the first structure for heat transfer 110 is formed in the shape of a lump. For example, in one example, the first structure for heat transfer 110 is formed in the shape of a circular pillar or a polygonal pillar having an upper surface and a lower surface. In such an example, the first structure for heat transfer 110 is formed of a metallic material such as a copper (Cu) or another metal or metallic alloy with similar properties. In another example, the first structure for heat transfer 110 is formed of a non-metallic material with a high thermal conductivity such as graphite, graphene, or the like. However, it will be recognized that while the first structure for heat transfer 110 is potentially made of different materials in different examples, the material that is chosen should have good thermal conductivity.

Referring to the examples of FIGS. 1A through 1G, the first structure for heat transfer 110 is formed by interposing a layer that is made of graphite or graphene between layers that are formed of the metallic material.

Subsequently, a layer that is formed of graphite or graphene is referred to as the first layer 119, and a layer that is formed of metallic material is referred to as the second layer 118-1 and the third layer 118-2.

Conventionally, graphite or graphene is formed to have a plate shape structure in which carbon atoms are connected to each other, and these plate shape structures are stacked together in a plurality of layers. A plane in which carbon atoms form the plate shape structure is referred to as an XY plane, and a direction in which a plurality of plate shape structures are stacked is referred to as a Z-axis direction. Graphite or graphene has a relatively high heat conductivity compared to any metallic material such as copper, and further has an especially higher heat conductivity in an XY plane direction than in a Z-axis direction.

Figure 1B:
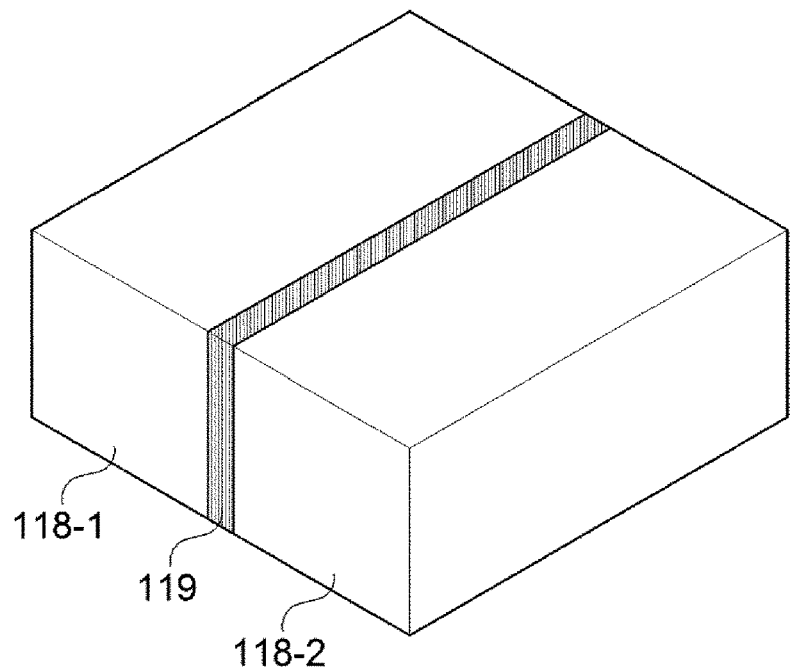
FIG. 1B is a perspective view schematically showing one example of the first structure for heat transfer according to an example.
Figure 1C:
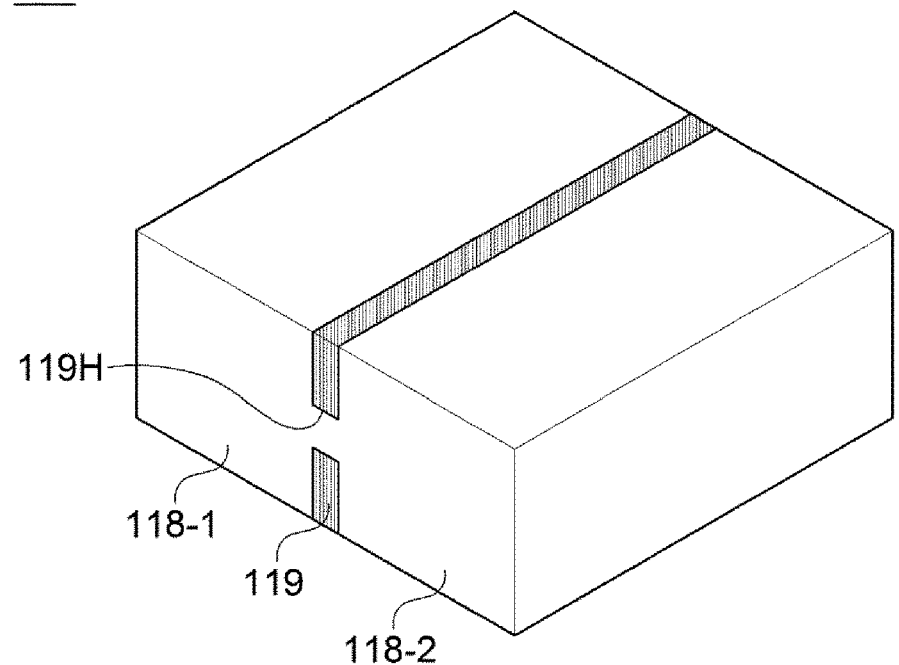
FIG. 1C is a perspective view schematically showing another example of the first structure for heat transfer according to an example.
Figure 1D:
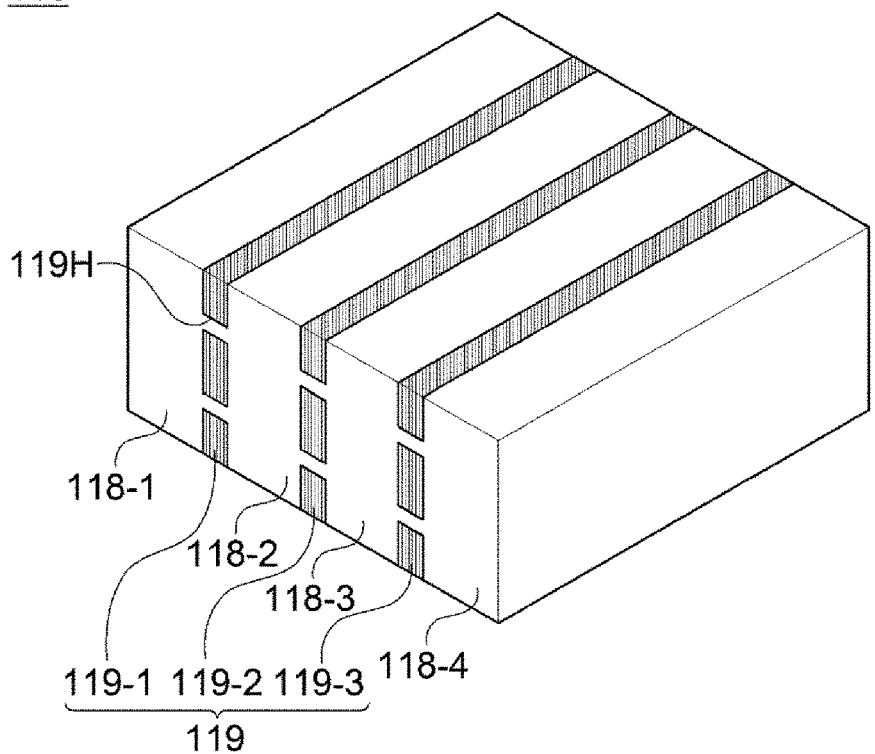
FIG. 1D is a perspective view schematically showing still another example of the first structure for heat transfer according to an example.

Thus, as shown in the examples of FIGS. 1B through 1D, in a case that the first layer 119 is arranged in a vertical direction, the heat conductivity between the upper surface and the lower surface of the first structure for heat transfer 110 is potentially improved. In particular, in an example in which an XY plane of graphite or graphene is arranged in the vertical direction, the heat conductivity in the vertical direction is further improved. Accordingly, the heat that the first electronic component 500 generates is rapidly dissipated in a downwards direction through the first structure for heat transfer 110.

Figure 1E:
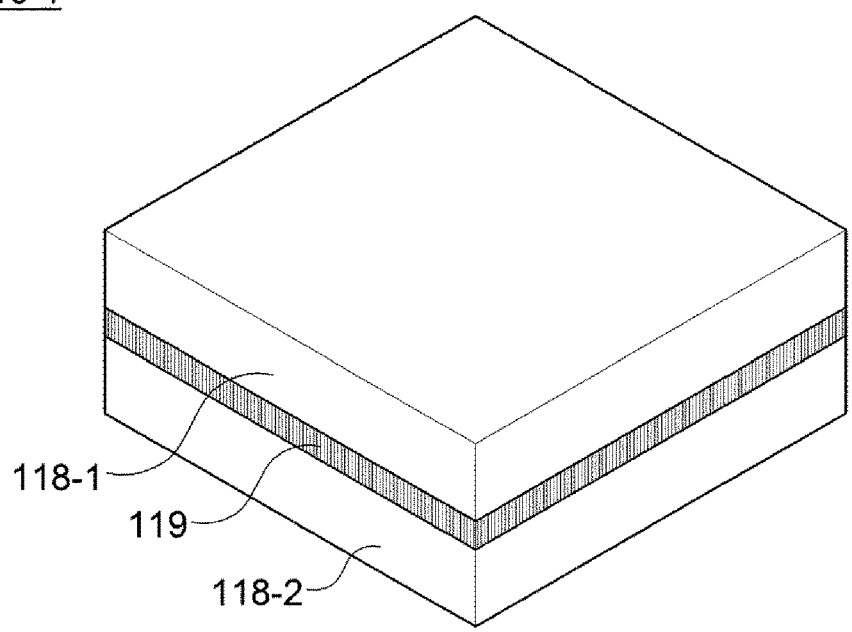
FIG. 1E is a perspective view schematically showing still another example of the first structure for heat transfer according to an example.
Figure 1F:
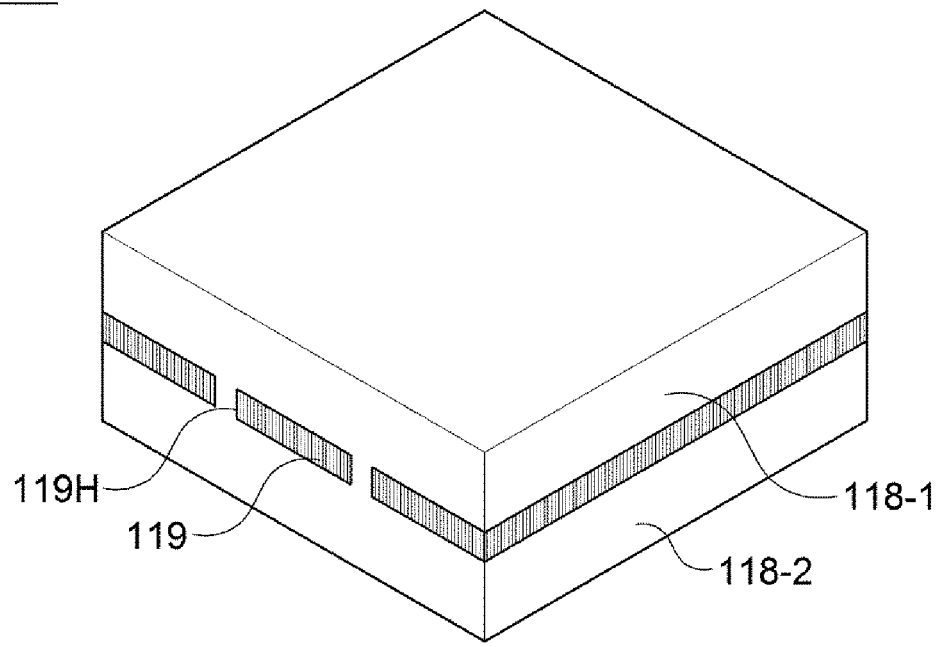
FIG. 1F is a perspective view schematically showing still another example of the first structure for heat transfer according to an example.
Figure 1G:
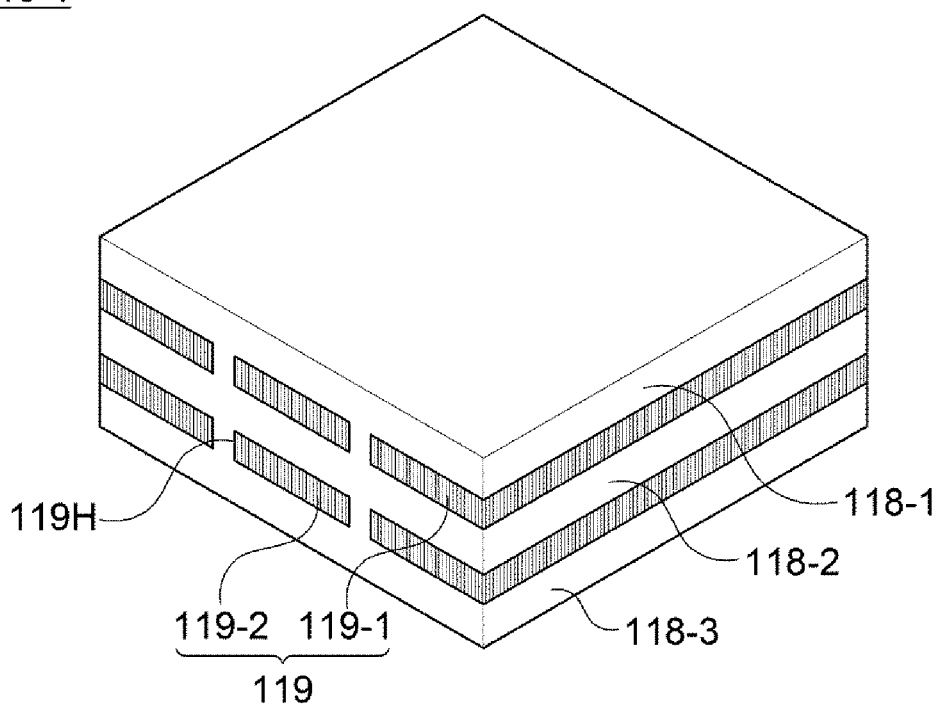
FIG. 1G is a perspective view schematically showing still another example of the first structure for heat transfer according to an example.

Also, as shown in the examples of FIGS. 1E through 1G, in an example in which the first layer 119 is arranged in the horizontal direction, the heat conductivity of the first structure for heat transfer 110 in the lateral direction, namely, in the horizontal direction, is possibly improved further. Especially, in an example in which the XY plane of graphite or graphene is arranged in the horizontal direction, the heat conductivity in the horizontal direction is further improved. Accordingly, the heat that the first electronic component 500 generates is transferred to the first structure for heat transfer 110 and then rapidly dissipated in the lateral direction. Also, in an example in which the first core layer 11 is formed to include an element for heat transfer in the horizontal direction in the circuit board 100, for example, such that a second structure for heat transfer is provided, it is further advantageous for improving the heat dissipation property. Also, the second structure for heat transfer is described further later.

For example, the first structure for heat transfer 110 is formed by situating the second layer 118-1 on one surface of the first layer 119 and the third layer 118-2 on the other surface of the first layer 119 of metallic material.

However, a plurality of constituent layers that form the first layer 119, such as constituent layers 119-1, 119-2, 119-3, are optionally disposed on the first structure for heat transfer 110, if needed.

Compared to the metallic material that forms the other layers, the graphite or the graphene that forms the first layer 119 has the heat conductivity that is relatively larger than that of the metallic material such as copper. Accordingly, if the number of the first layers increase, the heat transfer property of the first structure of heat transfer 110 is further improved by the increase in use of a material with better heat conductivity characteristics.

However, since vias V1, V2 that are in contact with the first structure for heat transfer 110 are formed to transfer electrical signals, the thickness or the number of constituent layers of the first layer 119 is potentially determined based on a volume, a shape, and thickness of the first structure for managing heat transfer and effective circuit wiring.

On the other hand, however, the hardness of graphite or graphene is relatively low compared to that of the metallic material. Especially in a case of graphite or graphene that is formed by stacking plate shape structures, the bonding power between stacked plates of graphite or graphene is relatively low. Also, because the first layer 119 and the second and the third layer 118-1 and 118-2 are formed of different materials, the bonding power on the boundary surface is relatively weakened, due to a lack of adhesion between the layers.

However, in a circuit board according to an example, the metallic material that penetrates the first layer 119 is formed integrally as a single unit with the metallic material that forms the second layer 118-1 and the third layer 118-2. As a result, the reliability of the first structure for heat transfer 110 is possibly improved. That is, the bonding power between plate structures of graphite or graphene that forms the first layer 119 is improved by using such an approach, and the bonding power or the adhesion strength of the boundary surface between the first layer 119 and the second and the third layers 118-1, 118-2 that are formed of different materials is also accordingly improved. Here, a hole that penetrates the first layer 119 is referred to as a through hole 119H.

The undescribed reference numerals 118-3 and 118-4 indicate additional layers that are formed of the metallic material.

In an example, the insulation part 120 is formed of one insulation layer or a plurality of insulation layers. In such an example, the insulation part 120 illustrated in FIG. 1A includes three insulation layers 10, 121, 121', and the insulation layer that is disposed on the center portion is the core part 10. However, this is merely an example and examples are not limited to such an arrangement.

In an example, the first structure for heat transfer 110 is situated in the middle of the insulation part 120. In such an example, in which the core part 10 is disposed as shown, a cavity C1 that penetrates the core part 10 is formed and the first structure for heat transfer 110 may be inserted in cavity C1.

In an example, vias that are formed in the insulation layer 120 are in contact with the first structure for heat transfer 110. Subsequently, the via that is formed on an upper portion of the first structure for heat transfer 110 is referred to as the first via V1, and the via that is formed on a lower portion of the first structure for heat transfer 110 is referred to as the second via V2. At least one metal pattern is situated on the insulation part 120, and subsequently, the metal pattern that is in contact with the first via V1 is referred to as the first metal pattern 131. The metal pattern that is in contact with the second via V2 is referred to as the second metal pattern 141. Also, the fourth via V4 and the fifth via V5 are potentially further disposed in the insulation part 120. The metal pattern that is contacted with the fourth via V4 is referred to as the third metal pattern 133, and the metal pattern that is contacted with the fifth via V5 is referred to as the fourth metal pattern 142.

In an example, the first structure for heat transfer 110 performs a function of keeping heat, and this function increases as the volume of the first structure for heat transfer increases. As shown in the examples of FIGS. 1A through 1G, the first structure for heat transfer 110 is formed in the cylindrical shape. As it is formed in a pillar shape in these examples, the volume of the first structure for the heat transfer 110 is maximized if the area of the lower surface is chosen accordingly. Also, if the shape of the lower and the upper surfaces of the first structure for heat transfer 110 is polygonal, especially rectangular, the first structure for heat transfer potentially satisfies the miniaturization goal of the first electronic component 500 or the miniaturization of circuit board 100, fine pattern pitch, or another miniaturization requirement. Also, as shown, the first structure for heat transfer 110 has a volume that is far larger than the alternative vias such as the first via V1 through the seventh V7. Accordingly, the vias of a plurality of vias are in contact with surfaces, especially the upper surface or the lower surface of the first structure for heat transfer 110. That is, the area of the upper surface and the lower surface of the first structure for heat transfer 110 themselves are larger than the alternative vias. Also, the entire volume of the first structure for heat transfer 110 is also more than double than that of an alternative structure. As a result, the first structure for heat transfer 110 is able to rapidly absorb the heat from a heat source, and to dissipate the heat using other routes that are connected to the first structure for heat transfer 110. Also, when the thickness of the first structure for heat transfer 110 is increased, the distance between the first structure for heat transfer 110 and the hot spot is accordingly decreased so that a time for the heat to flow to the first structure for heat transfer 110 is shortened.

In one example, the first electronic component 500 is mounted on one surface of the circuit board 100. Also, in an example, the circuit board 100 is mounted on one surface of an additional board 800 such as a main board. For example, the first electronic component 500 is an electronic part, such as an application processor, and generates heat during its operation.

When the first electronic component 500 operates, the heat is generated. However, when detecting the heat that the first electronic component 500 generates, there is a region in which more heat is generated than other regions. This region is referred to as a hot spot. Such a hot spot is formed on a predetermined region of the circuit board 100. For example, the hot spot is formed on one or more points, having the first electronic component 500 as the center. Also, these hot spots are potentially formed around a power terminal of the first electronic component 500, or in a region in which switching elements are relatively concentrated due to the increased heat generation in these areas.

In an example, the first electronic component 500 includes a relatively high performance region and a relatively low performance region. For example, one processor that consists of cores operating at 1.8 GHz and another processor that consists of cores operating at 1.2 GHz are arranged in different regions of the first electronic component. Referring to the example of FIG. 3, the first electronic component 500 includes the first unit region 510 and the second unit region 520. The first unit region 510 operates at higher speed than the second unit region 520. Hence, the first region 510 consumes much more power than the second unit region 520 does. Accordingly, the first unit region 510 generates much more heat than the second unit region 520 does as waste heat from the processing at a higher power.

In the circuit board 100 according to an example, the first structure for heat transfer 110 is disposed adjacent to the hot spot. Accordingly, the first structure for heat transfer 110 rapidly receives the heat from the hot spot to dissipate to other regions of the circuit board 100 or other devices such as main board, such as, for example, the additional board 800 in FIG. 1A, on which the circuit board is mounted.

In an example, at least a portion of the first structure for heat transfer 110 is situated below the first electronic component 500.

The circuit board 100 according to an example potentially further includes the second electronic component 200. In examples the second electronic component 200 is a capacitor, an inductor, a resistor, or a similar component used as part of an electronic circuit.

In an example, that the first electronic component 500 is the application processor, the first electronic component 500 is optionally connected to the capacitor in order to reduce a power noise. In such an example, it is potentially helpful to choose a distance between the capacitor and the first electronic component that is relatively short in order to increase the noise reduction effect.

Accordingly, at least a portion of the second electronic component 200 is situated below the first electronic component 500. As a result, the noise reduction effect is increased.

In an example, almost all portions of the first structure for heat transfer 110 are situated at the region below the first electronic component 500. Also, an area of the upper surface of the first structure for heat transfer 110 is possibly smaller than the area of the upper surface of the first electronic component 500. Furthermore, in such an example, the area of the upper surface of the first structure for heat transfer 110 is determined to correspond to a width of hot spot region of the first electronic component 500.

Accordingly, the heat from the hot spot is rapidly transferred to the first structure for heat transfer 110. Also, such an approach is advantageous for a lighter weight of the circuit board 100 and also a circuit board 100 that reduces warping. In addition, it increases an efficiency of processing to situate the first structure for heat transfer 110 on the circuit board 100.

In an example, almost all portions of the second electronic component 200 are situated at the region below the first electronic component 500. The second electronic component 200 is situated at the region below the first electronic component 500, where the first structure for heat transfer 110 is not situated. Also, by comparison to the second electronic component 200, the first structure for heat transfer 110 is situated nearer to the hot spot.

Referring to FIGS. 1A through 1G and FIGS. 2 through 4, it is to be understood that, in an example, the first structures for heat transfer 110 and the second electronics components 200 are inserted in cavities C1, C2 in the core part 10. The first cavity C1 and the second cavity C2 are formed in the core part 10. In such an example, the first structure for heat transfer 110 is inserted into the first cavity C1 and the second electronic component 200 is inserted into the second cavity C2. It is to be understood in this example that at the region below the first electronic component 500, the first structures for heat transfer 110 and the second electronic components 200 are situated adjacent to each other, and in particular, the first structures for heat transfer 110 are situated intensively around the hot spot, which is illustrated in FIGS. 3-4. FIG. 5 illustrates schematically a plan view in an example in which there is no core part 10 in the insulation part 120.

Accordingly, by using these approaches, it becomes possible to maximize the power noise reduction by the second electronic component 200 and to transfer the heat that is generated at the hot spot.

In an example, the first electronic component 500 is coupled to the circuit board 100 by means of a solder (S) or a similar binder that attaches these two elements together. For example, the first electronic component 500 is coupled to the first metal pattern 131, the third metal pattern 133, the seventh metal pattern 134, and so on, by means of solder (S) or an alternative binder.

Also, the second metal pattern 141, the fourth metal pattern 142, the fifth metal pattern 143, the sixth metal pattern 144, and so on, are coupled to the additional board 800, such as a main board, by means of solder (S). In an example, rather than an alternative solder, the third structure for heat transfer L1 that is formed of a similar material and in a similar shape to the first structure for heat transfer 110, is interposed between the second metal pattern 141 and the additional board 800. In order to transfer heat of the first structure for heat transfer 110 to the additional board 800, the third structure for heat transfer L1, which is formed of material having higher heat conductivity than the conventional solder and is formed to have a lump shape, is used for coupling the second metal pattern 141 and the additional board 800 to one another. In addition, in order to rapidly receive heat of the third structure for heat transfer L1 and to dissipate such heat, a heat radiation part L2 is situated in the additional board 800. The heat radiation part L2 is exposed in the direction of the upper surface of the additional board 800, and is also exposed in the direction of the lower surface of the additional board 800 to increase the heat radiation efficiency, if desired.

A metal pattern, which is situated at the outer part of the board so as to be connected to other electronic components, for example, the first electronic component 500 or the additional board 800, is referred to as a pad. Various circuit patterns as well as pads are situated on the outermost metal layer, and a solder resist layer, not shown, is optionally situated so as to protect the circuit pattern or the insulation part 120. At least a portion of pads for connecting to the external device are exposed to the outside of such a solder resist layer. In an example, the pad that is exposed to the solder resist layer and the terminal of the external device are physically coupled to each other by a coupling means, such as solder or wire, not shown.

As illustrated in the example of FIG. 1, in an example that the first through the seventh metal patterns are exposed to the outer surface of the insulation part 120, the first through the seventh metal patterns are considered to be the aforementioned pads. In addition, various surface processed layers such as a nickel-gold plating layer are optionally situated on surfaces of the metal patterns that are exposed to the outside of the solder resist layer.

Although not shown, an insulation layer that covers the outer surface of the first metal pattern 131 and a pad that is formed on the outer surface of the insulation layer are optionally further situated, and the first metal pattern 131 and the pad is connected by a via that penetrates through the insulation layer. That is, a built-up layer including the insulation layer and the metal layer is further situated, if desired or required. In such an example, the aforementioned metal pattern 131 is no longer a pad, and is connected to the pad that is formed on the outmost metal layer of the circuit board by means of a via or a similar connector.

Accordingly, heat that is generated at the hot spot is rapidly transferred to the additional board 800 through a route starting at the first metal pattern 131, then progressing through the first via V1, then the first structure for heat transfer 110, then the second via V2 then the second metal pattern 141 as its transfer route.

Alternatively, in an example in which a contact that is to be connected to the first metal pattern among contacts of the first electronic component 500 is a terminal for transmitting signals, the route starting at the first via V1, then progressing through the first structure for heat transfer 110, then the second via V2, then the second metal pattern 141 performs a function of transmitting signals. The contact pads or terminals of the additional board 800 that are to be connected to the second metal pattern 141 also potentially perform the function of transmitting signals.

In an example in which a contact that is to be connected to the first metal pattern among contacts of the first electronic component 500 is not a terminal for transmitting signals, the route of starting at the first via V1, then progressing through the first structure for heat transfer 110, then the second via V2, then the second metal pattern 141 is electrically connected to a ground terminal, not shown. The contact pads or terminals of the additional board 800 that is to be connected to the second metal pattern 141 are also potentially electrically connected to the ground terminal. In this example, the ground terminal is situated on at least one of the circuit board 100 and the additional board 800.

In an example that a contact that is to be connected to the first metal pattern among contacts of the first electronic component 500 is a power terminal, the route starting at the first via V1, then progressing through the first structure for heat transfer 110, then the second via V2, then the second metal pattern 141 is electrically connected to a power providing circuit, not shown. The contact pads or terminals of the additional board 800 to be connected to the second metal pattern 141 are also electrically connected to the power providing circuit. In this example, the power providing circuit is situated on at least one of the circuit board 100 and the additional board 800.

In an example, a contact that is to be connected to the first metal pattern among contacts of the first electronic component 500 is a dummy terminal. In such an example, the dummy terminal is used as a passage for transferring heat to the outside of the first electronic component 500.

As described above, terminals of the first electronic component 500 are divided into terminals for signal input/output, a terminal for power input/output, and a terminal for heat radiation. It is to be noted that a certain terminal potentially performs more than one function. That is, a terminal is potentially used for heat radiation as well as power input/output. However, once terminals that are disposed at the hot spot of the first electronic component 500 performs the heat radiation function, heat of the hot spot is more rapidly dissipated. By placing the terminal for heat radiation in contact with the first coupling means and placing the first coupling means in contact with the first metal pattern 141, the heat movement between the hot spot and the first structure for heat transfer 110 is made to be much smoother.

In an example, at least one terminal of the first electronic component 500 that is to be electrically connected to the first structure for heat transfer 110 is a dummy terminal that is dedicated for the heat radiation. If a terminal used only for signal input/output among terminals of the first electronic component 500 is connected to the first structure for heat transfer 110, a signal loss possibly occurs. Thus, in an example the terminal for signal input/output is not electrically connected to the first structure for heat transfer 110. That is, a via or a circuit pattern that is connected to a pad in order to be connected to the terminal only for signal input/output among terminals of the first electronic component 500 is not electrically connected to the first structure for heat transfer 110 based on this rationale.

Referring to FIGS. 1A through 9, the circuit board 100 according to an example includes the core part 10. For example, the core part 10 reinforces a rigidness of the circuit board 100 in order to relieve a problem that occurs due to the warping. In addition, by including a material with high heat conductivity in the core part 10, heat that is generated at a local region such as a hot spot is rapidly dissipated to other regions of the circuit board 100 in order to relieve a problem due to overheating.

The first upper insulation layer 121 is situated on the upper surface of the core part 10, and the first lower insulation layer 121' is situated on the lower surface of the core part 10. In addition, the second upper insulation layer 122 and the second lower insulation layer 122' are further situated appropriately.

In one example, the core part 10 includes the second structure for heat transfer. For example, the core part 10 includes the first core layer 11 that is made of graphite or graphene. As discussed previously, graphite or graphene has relatively high heat conductivity in an XY plane direction. As a result, graphite or graphene dissipates heat effectively and rapidly.

In an example, the second structure for heat transfer is in direct contact with a side surface of the first structure for heat transfer 110. For example, a side surface of the second structure for heat transfer is exposed to the first cavity C1 that is formed in the core part 10. Also, the first structure for heat transfer 110 is in contact with the first cavity C1. In another example, a highly thermally conductive material is interposed between the second structure for heat transfer and the first structure for heat transfer 110. For example, Terminal Interface Material (TIM) is applied as the highly thermally conductive material. In examples, such a TIM includes polymer-metal composite material, ceramic composite material, carbon-based composite material, or a similar appropriate material, where these enumerated materials are merely examples. For example, a mixture of epoxy and carbon fiber filler, with a heat conductivity of about 660 W/mk, Silicon Nitride ($Si_3N_4$), with a heat conductivity of about 200-320 W/mk, a mixture of epoxy and Boron Nitride (BN), with a heat conductivity of about 19 W/mk, or another appropriate material is applied as a TIM. Accordingly, heat that is transferred into the first structure for heat transfer 110 is rapidly dissipated in the horizontal direction by using the second structure for heat transfer as well as in the vertical direction, as previously discussed further.

Because the first structure for heat transfer 110 and the second structure for heat transfer are in contact with each other directly or by means of a TIM, heat of the first electronic component 500 is rapidly transferred into the first structure for heat transfer 110 and then dissipated more rapidly, compared to an example in which heat is transferred in the downward direction only. Compared to the example that temperature at a certain region such as hot spot rises excessively, because heat is dissipated evenly across the entire region of the circuit board 100, temperature variations of each component or element on the circuit board 100 are decreased so that the reliability is increased. In addition, since heat is rapidly dissipated across the entire region of circuit board 100, the circuit board 100 itself functions as a kind of heat radiation plate, so that it provides an effective result of an enlarged heat radiation area.

In an example, the first circuit pattern P1 and the second circuit pattern P2 are situated on surfaces of the core part 10, and the first circuit pattern P1 and the second circuit pattern P2 are electrically connected to each other by means of a through via TV that penetrates through the core part 10. In such an example, the first circuit pattern P1 is connected to the third metal pattern 133 by means of the fourth via V4. Also, the second circuit pattern P2 is connected to the fourth metal pattern 142 by means of the fifth via V5. Additionally, the third metal pattern 133 is connected to the first electronic component 500 by means of solder (S), and the fourth metal pattern 142 is connected to contact pad 810 of the additional board 800 by means of solder (S). Here, the solder (S) acts as a binder between the various components. Accordingly, routes for transmitting electrical signals between the first electronic component 500 and the additional board 800 are further secured.

The second core layer 12 is situated on one surface of the first core layer 11. Also, the third core layer 13 is situated on the other surface of the first core layer 11. In an example, at least one of the second core layer 12 and the third core layer 13 is formed of insulating material such as PPG, which is a combination of glass fibers and polypropylene. In another example, the second core layer 12 and the third core layer 13 are formed of a metal such as copper or invar. Here, invar, also known generically as 64FeNi or FeNi36 is a nickel-iron alloy notable for its uniquely low coefficient of thermal expansion. In still another example, the first core layer 11 may be formed of invar, and the second core layer 12 and the third core layer 13 may be formed of copper. In an example such that at least one of the second core layer 12 and the third core layer 13 is formed of conductive material, since the first circuit pattern P1 or the second circuit pattern P2 is formed on surfaces of the core part 10, it is possible for signals to be transmitted via an unintended route. Thus, a means for securing an insulation property are situated on surfaces of the core part 10 in such an example.

In an example, the second electronic component 200 is inserted in the second cavity C2 of the core part 10. Also, the second electronic component 200 is connected to the seventh metal pattern 134 by means of the sixth via V6 and the sixth metal pattern 144 by means of the seventh via V7, respectively. In some examples, the second electronic component 200 is a passive element such as an inductor, a capacitor, or a similar passive electronic component, and in other examples, the second electronic component 200 is an active element such as an integrated circuit, if desired or required. In an example in which the second electronic component 200 is a capacitor, the terminal of the first electronic component 500 to be connected to the seventh metal pattern 134 is a power terminal. That is, in such an example, the second electronic component is embedded as a de-coupling capacitor to reduce the power noise of the first electronic component 500.

In this example, it is better to provide a distance between the capacitor and the first electronic component that is short in order to increase a noise reduction effect. For this purpose, in an example, at least a portion of the second electronic component 200 is situated below the first electronic component 500.

Although not illustrated, rather than a cavity that penetrates the core part 10, a recess that is a depressed portion of the core part 10 is formed. In such an example, the first structure for heat transfer 110 or the second electronic component 200 is inserted into the recess.

Referring to the example of FIG. 1, the thickness of the first structure for heat transfer 110 is selected to be larger than a height from the lower surface of the second circuit pattern P2 to the upper surface of the first circuit pattern P1. Furthermore, as compared to the upper surface of the first circuit pattern P1, the upper surface of the first structure for heat transfer 110 is situated to be closer to the upper surface of the circuit board 100. Accordingly, the heat capacity of the first structure for heat transfer 100 is increased so that the function of keeping heat is improved. Furthermore, the distance between the first structure for heat transfer 110 and the hot spot decreases. As a result, the time that is used for heat to move from the hot spot to the first structure for heat transfer 110 is shortened further.

In one example, the bottom surface of the first structure for heat transfer 110 and the lower surface of the second circuit pattern P2 are situated on the same horizontal plane. Even in this example, the thickness of the first structure for heat transfer 110 is potentially selected to be larger than a height from the lower surface of the second circuit pattern P2 to the upper surface of the first circuit pattern P1. Accordingly, the heat capacity of the first structure for heat transfer 100 is increased, and the distance between the first structure for heat transfer 110 and the hot spot decreases.

Although not shown, in another example, the upper surface of the first structure for heat transfer 110 and the upper surface of the first circuit pattern P1 are disposed on the same horizontal plane. Even in this case, the thickness of the first structure for heat transfer 110 is selected to be larger than a height from the lower surface of the second circuit pattern P2 to the upper surface of the first circuit pattern P1. Accordingly, the heat capacity of the first structure for heat transfer 100 is increased. Although a theoretical or an ideal geometrical relationship is described above to help explain the examples, when this structure is applied to an actual design made by a manufacturing process, variances possibly arise during the manufacturing process. For example, in actual manufacturing, both surfaces of the core part are not always perfectly flat, or thicknesses of circuit patterns are changed during the process of forming circuit patterns on the core part. Therefore, when interpreting the scope of the present examples, the actual process variances or the like are to be considered to ensure that the process takes into account practical issues. In addition, due to the trend of slimness of electronic devices and high density of wiring patterns, a certain degree of warping potentially occurs during the manufacturing process of a circuit board. When this warping is intensified, it may cause a short circuit in wiring or a crack. As a result, there have been many efforts to minimize the warping. However, practically, it is not possible to eliminate the warping completely, and even though a warping occurs but falls in a certain range, a circuit board is still potentially sorted into being a good product of acceptable quality. Thus, in the circuit board according to an example, a warping that falls within a certain range is allowed, and when understanding the description about the thickness or location of the first structure for heat transfer 110, the allowed range of warping is to be considered as well.

Referring to the example of FIG. 2, although the second upper insulation layer 122 is formed on the first upper insulation layer 121, even in this case, it is to be understood that the heat capacity of the first structure for heat transfer 110 is increased and at the same time the heat dissipation speed is also increased by making the height of the first via V1 or the second via V2 that is interposed between the outer surface of the circuit board 100 and the first structure for heat transfer 110 smaller than that of the via that connects the outer surface of the circuit board 100 to the inner patterns P1', P2'. Although not shown, in an example the upper surface of the first structure for heat transfer 110 is covered by the first upper insulation layer. Also, the other surface of the via by which one surface is contacted with the first structure for heat transfer 110 is possibly in contact with the circuit pattern that is disposed on the first upper insulation layer. Further, the via is connected to the first electronic component through another via that penetrates through the second upper insulation layer and another circuit pattern that is situated on the second insulation layer and the solder ball. That is, the number of build-up layers to be formed on the first structure for heat transfer 110 is possibly changed, if desired or required. However, it is to be understood that the lager the thickness of the first structure for heat transfer, the better the heat capacity.

Referring to the example of FIG. 6, an insulation film 14 is situated on the surfaces of core part 10. In an example, the first core layer 11 through the third core layer 13 have a good electrical conductivity as well as a good heat conductivity. Thus, in case that the first circuit pattern P1 is situated on the surface of the core part 10, it is required to prevent a current flow though an unwanted path that is caused by the conductivity of the core part 10. In such an example, the insulation film 14 is formed on the core part by vapor deposition with parylene or another appropriate material. During a time period in which a through via hole for forming a through via TV is processed, the insulation film is formed on an inside of the through via hole by providing an insulating material on the surface of the core part 10. Accordingly, the insulation is secured between the through via TV, the first and the second circuit patterns P1, P2 and the core part 10.

In an example, a core via hole that penetrates the second core layer 12 and the third core layer 13 so as to expose a portion of the first core layer 11 is formed. In this example, the eighth via that is formed by disposing a conductive material in the core via hole is located to be in direct contact with the first core layer 11. For example, the insulation film 14 is formed on the surface of the core part 10 during a time period when the core via hole is provided, the insulation film 14 is formed on the exposed surface of the first core layer 11 so that the first core layer 11 is disposed to face the eighth via V8. The insulation film 14 is interposed between the first core layer 11 and the eighth via V8. In an example in which heat moves to the eighth via V8 that is directly, or indirectly by means of the insulation film 14, in contact with the first core layer 11, heat is be rapidly dissipated in this direction, which is horizontal to the circuit board 100, along the first core layer 11.

In an example, the second structure for heat transfer is formed of graphite or graphene. Accordingly, heat that moves from a heat source such as the first electronic component 500 or the like to the first structure for heat transfer is rapidly dissipated in the horizontal direction through the second structure for heat transfer. Especially, as shown in FIGS. 1E through 1G and 2, in an example in which the first structure for heat transfer 110 is provided by arranging the first layer in the horizontal direction, the heat radiation efficiency in the horizontal direction is improved through the first core layer 11, as shown in FIG. 6.

As shown in the example of FIG. 6, a penetration hole 11c is formed in the first core layer 11. Also, the second core layer 12 and the third core layer 13 are connected to each other in the integrated fashion to firmly support the first core layer 11. Accordingly, the inter-layer bonding power is reinforced even though the first core layer 11 is formed of a graphite material or a graphene material.

Referring to the example of FIG. 7, an example in which a primer layer 111 is situated on the outer surface of the first core layer 11' is depicted. That is, the inter-layer bonding power is improved by situating the primer layer 111 on the outer surface of the graphite sheet. Such a primer layer 111 improves not only the inter-layer bonding power between graphite sheets, but also the inter-layer bonding power between the first core layer 11' and the second core layer 12 and between the first core layer 11' and the third core layer 13.

In another example, referring to the example of FIG. 8, the first core layer 11" is provided by stacking unit structures 11-1, 11-2, 11-3, 11-4, that are formed by situating the primer layer 111 on the surface of a graphite layer, in the vertical direction. In this example, a degree in the heat radiation of the first core layer 11" in the horizontal direction is minimized and at the same time the de-lamination of the first core layer 11" in the vertical direction is relieved.

In still another example, referring to the example of FIG. 9, the first core layer 11''' is provided by stacking unit structures 11-1, 11-2, 11-3, 11-4. Such structures are formed by disposing the primer layer 111 on the surface of graphite, in the horizontal direction. For example, the XY plane of graphite is arranged in parallel to the vertical direction. In this case, the heat radiation in the horizontal direction is decreased more or less and does not always improve, but the heat radiation in the vertical direction improves.

The first structure for heat transfer 110 of the circuit board 100 according to an example includes an adhesion strength reinforcing part for improving the adhesion strength to the insulation part 120.

In an example where the surface of the first structure for heat transfer 110 is in direct contact directly with the insulation part 120, the first structure for heat transfer 110 and the insulation part 120 are separated from each other during a reflow process or solder pot process. This practice is referred to as delamination. As a means for improving the adhesion strength to the insulation part 120, the primer layer 111 is situated on the surfaces of the first structure for heat transfer 110. In an example, the primer layer 111 is formed of a primer that includes isopropyl alcohol and an acryl-based silane agent.

Also, in another example, the primer layer 111 is formed of MPS (3-(trimethoxysilyl)propylmethacrylate), and a silane-based additive is added to the primer layer 111.

Figure 10A:
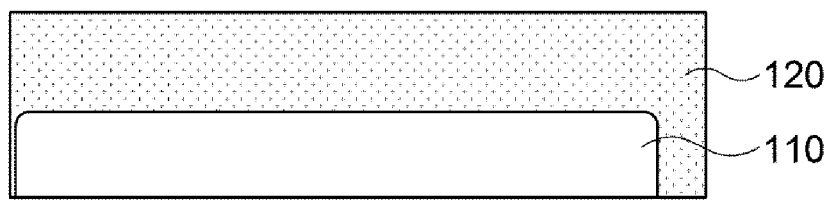
FIG. 10A shows the reflow test result that is performed during the time period in which the primer layer 111 is situated on the surfaces of the structure for heat transfer.
Figure 10B:
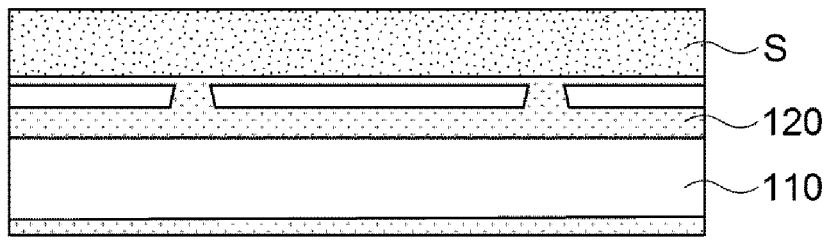
FIG. 10B shows the solder pot test result that is performed during the time period in which the primer layer 111 is disposed on the surfaces of the structure for heat transfer.
Figure 12:
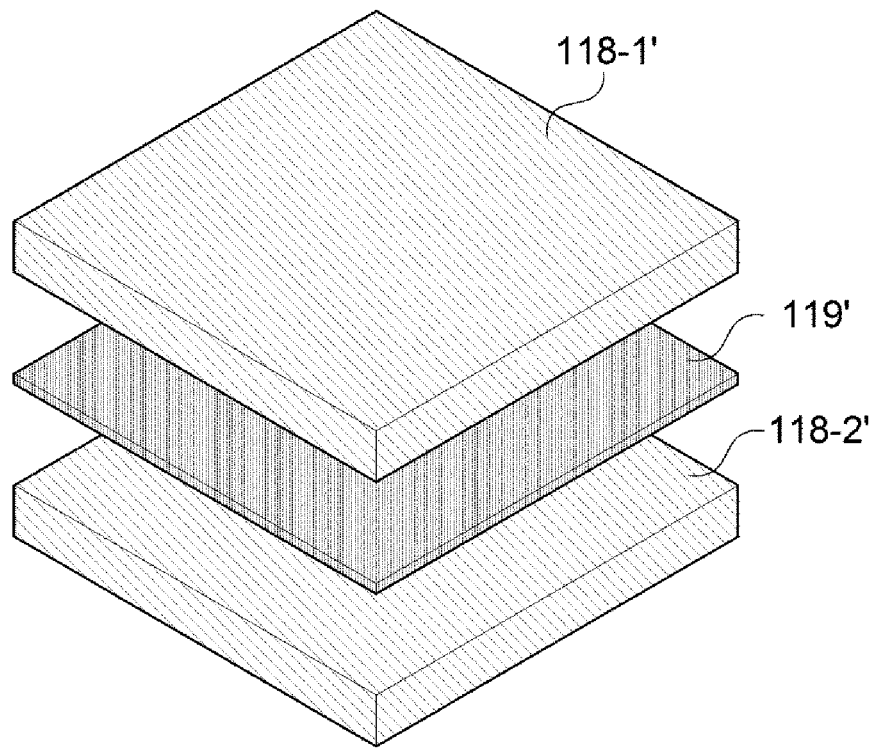
FIG. 12 illustrates a method of manufacturing the first structure for heat transfer according to an example.
Figure 13:
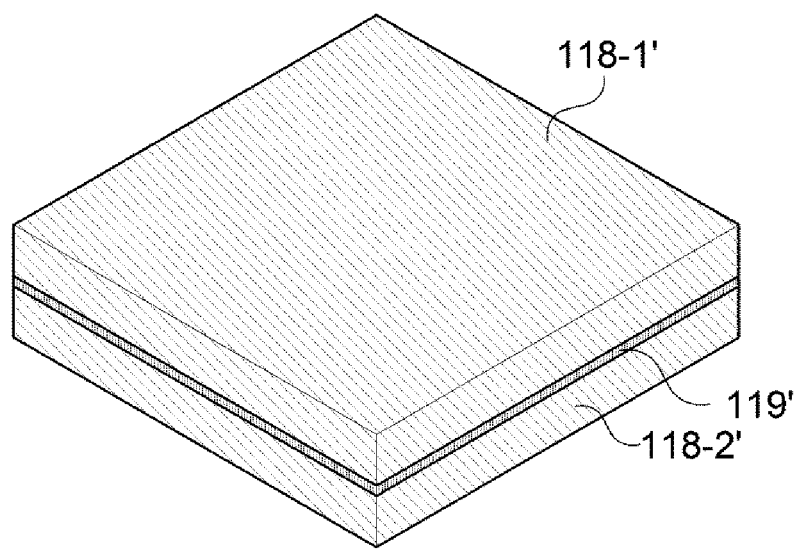
FIG. 13 illustrates a method of manufacturing the first structure for heat transfer according to an example.

FIG. 10A shows a reflow test result that is performed during a time period in which the primer layer 111 is situated on the surfaces of the structure for heat transfer. FIG. 10B shows the solder pot test result that is performed during a time period in which the primer layer 111 is disposed on the surfaces of the structure for heat transfer. FIG. 11A shows a reflow test result that is performed during a time period in which the insulation part 120 is in direct contact with the structure for heat transfer. FIG. 11B shows the solder pot test result that is performed during a time period in which the insulation part 120 is in direct contact with the structure for heat transfer.

Referring to FIGS. 10A through 11B, in an example in which the reflow process or the solder pot process is performed when there is no primer layer 111, a delaminated space D is formed between the structure for heat transfer and the insulation part 120. It is to be understood that the adhesion strength between the structure for heat transfer and the insulation part 120 is improved by situating the primer layer on the surfaces of the structure for heat transfer. The structure for heat transfer is at least one of the first structure for heat transfer 110 and the second structure for heat transfer.

A surface processing, such as a black-oxidizing process, and a roughing treatment process is performed on the surfaces of the first structure for heat transfer 110. As a result, the adhesion strength between the first structure for heat transfer 110 and the insulation part 120 is improved.

However, if the surfaces of the first structure for heat transfer 110 are processed as previously mentioned, a problem potentially arises during the manufacturing process. For example, the color of the first structure for heat transfer 110 potentially changes due to the surface process. In such an example, faults potentially occur frequently when an automatic equipment that mounts the first structure for heat transfer 110 on a certain position of the insulation part 120 identifies the first structure for heat transfer 110.

Accordingly, in the circuit board 100 according to an example, the de-lamination between the first structure for heat transfer 110 and the insulation part 120 is decreased.

Referring to FIGS. 1A through 1F, in an example in which the primer layer 111 is situated on the surfaces of the first structure for heat transfer 110, the first via V1 or the second via V2 penetrate the primer layer 111 as well and are in direct contact directly with the first structure for heat transfer 110. Thus, the decrease in heat transfer performance due to the primer layer 111 is minimized. Here, the thickness of the primer layer 111 is depicted in an exaggerated manner for a better understanding of the primer layer 111. However, the primer layer 111 is formed to have the thin film shape. Thus, the primer layer 111 in the actually embodied circuit board is potentially substantially thinner than that shown in the accompanying drawings. Thus, when understanding the present examples, the exaggerated expression of the drawings is to be considered as well. Especially, in FIG. 1A, the lower surface of the primer layer 111 and the second circuit pattern P2 are depicted to be situated along the same plane, and the bottom surface of the first structure for heat transfer 110 except the primer layer 111 is depicted to be situated somewhat higher than the second circuit pattern P2. However, the thickness of the primer layer 111 is very small compared to the thickness of the second circuit pattern P2 or the thickness of the first structure for heat transfer 110. Therefore, when understanding the positional relationship between the first structure for heat transfer 110 and the second circuit pattern P2, the thickness of the primer layer 111 is potentially ignored.

FIGS. 12 through 14A illustrate a method of manufacturing the first structure for heat transfer according to an example.

Referring to FIGS. 12 through 14A, the method of manufacturing a circuit board according to an example provides the first structure for heat transfer 110 by forming the second layer 118-2 and the third layer 118-2 that are formed of a metallic material on both surfaces of the first layer 119, wherein the first layer 119 is formed of graphite or grapheme, as discussed above.

For example, the first structure for heat transfer 110 is mass-produced by using the first preliminary layer 119' through the third preliminary layer 118-2', where the layers have certain areas. For example, the first preliminary layer 119' through the third preliminary layer 118-2' may be provided so as to have a sheet shape that has relatively large area compared to its thickness, and then by performing a dicing process, the first structure for heat transfer 110 including the second layer 118-1, the first layer 119, and the third layer 118-2 are mass-produced. After the dicing process, the portion that corresponds to the first preliminary layer 118-1' becomes the first layer 119, the portion that corresponds to the second preliminary layer 118-1' becomes the second layer 118-1, and the third preliminary layer 118-2' becomes the third layer 118-2.

In FIGS. 12 through 14A, the first layer 119 through the third layer 118-2 are illustrated to be provided by a lamination process. However, as shown in FIG. 15, by performing a plating process on the upper surface and the lower surface of the first layer 119-1, the second layer 118-1 and the third layer 118-2 are formed. By performing the plating process during a time period in which the penetration hole 119H is formed in the first layer 119-1 to provide the metallic material, the second layer 118-1, the third layer 118-2, and the metallic material that is filled in the penetration hole 119H are formed in the integrated fashion. Thus the bonding power between the first layer 119-1 and the second layer 118-1 and between the first layer 119-1 and the third layer 118-2 is increased. Also, the inter-layer bonding power of graphite or graphene that forms the first layer 119-1 is increased. After further forming the third layer 119-2 on the outer surface of the third layer 118-2, the third layer 118-3 is further situated thereon.

Figure 14B:
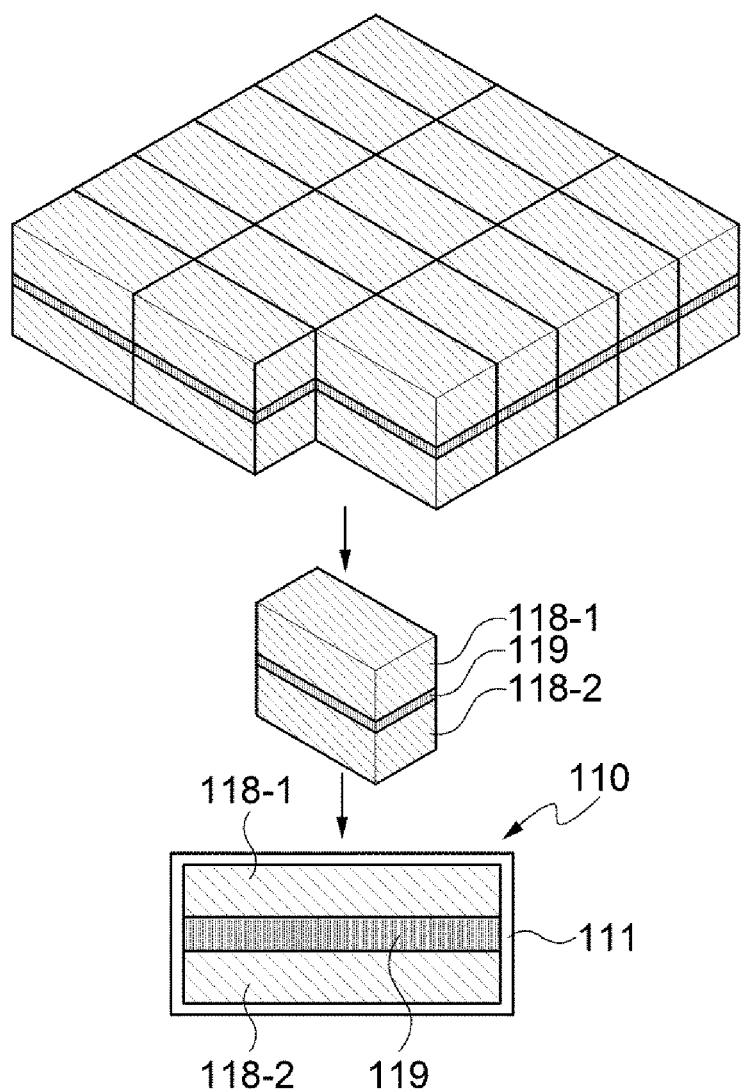
FIG. 14B illustrates a method of manufacturing the first structure for heat transfer according to another an example.

Referring to FIG. 14B, after forming the second preliminary layer 118-1', the first preliminary layer 119', and the third preliminary layer 118-2', by adjusting the dicing line and performing the dicing process, the first structure for heat transfer 110-1 in which the first layer is arranged in the horizontal direction is provided.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit board, comprising:
   insulation layers;
   a structure for heat transfer, wherein at least a portion of the structure for heat transfer is inserted into at least a portion of the insulation layers;
   metal layers formed on one or more surfaces of each of the insulation layers; and
   vias that penetrate at least one of the insulation layers to connect at least two of the metal layers with one another,
   wherein the structure for heat transfer comprises
   a first layer, formed of graphite or graphene,
   a second layer, located on one surface of the first layer and formed of metallic material,
   a third layer, located on the other surface of the first layer and formed of metallic material, and
   penetration holes that penetrate through the first layer and are filled with the same metallic material as the metallic material that forms the second layer and the third layer,
   wherein a boundary surface between the first layer and the second layer or a boundary surface between the first layer and the third layer is perpendicular to a boundary between the insulation layers, and
   wherein no boundaries are formed between the second layer, the third layer and the metallic material filled in the penetration holes.

2. The circuit board of claim 1, wherein an XY plane of graphite or graphene is formed in parallel with the boundary surface between the first layer and the second layer.

3. The circuit board of claim 2, wherein the first layer is formed in plural, and the plurality of first layers are arranged to be spaced apart from one another so as to form the structure for heat transfer.

4. The circuit board of claim 1, further comprising:
   a first insulation layer, comprising a cavity into which at least a portion of the structure for heat transfer is inserted;
   a first via, penetrating a second insulation layer that is located above the first insulation layer;
   a second via, penetrating a third insulation layer that is located below the first insulation layer;
   a first metal pattern, located on an outer surface of the second insulation layer and in contact with one end of the first via; and
   a second metal pattern, located on an outer surface of the third insulation layer and in contact with one end of the second via,
   wherein the boundary surface between the first layer and the second layer and the boundary layer between the first layer and the third layer are perpendicular to the boundary surface between the first insulation layer and the second insulation layer.

* * * * *